United States Patent
Louderback

(10) Patent No.: US 9,728,936 B2
(45) Date of Patent: Aug. 8, 2017

(54) METHOD, SYSTEM AND APPARATUS FOR HYBRID OPTICAL AND ELECTRICAL PUMPING OF SEMICONDUCTOR LASERS AND LEDS FOR IMPROVED RELIABILITY AT HIGH TEMPERATURES

(71) Applicant: Zephyr Photonics Inc., Zephyr Cove, NV (US)

(72) Inventor: Duane Louderback, Zephyr Cove, NV (US)

(73) Assignee: ZEPHYR PHOTONICS INC., Zephyr Cove, NV (US)

( * ) Notice: Subject to any disclaimer, the term of this patent is extended or adjusted under 35 U.S.C. 154(b) by 667 days.

(21) Appl. No.: 14/135,108

(22) Filed: Dec. 19, 2013

(65) Prior Publication Data

US 2015/0333477 A1      Nov. 19, 2015

Related U.S. Application Data

(60) Provisional application No. 61/747,298, filed on Dec. 29, 2012.

(51) Int. Cl.
*H01S 5/04* (2006.01)
*H04B 10/50* (2013.01)
(Continued)

(52) U.S. Cl.
CPC .......... *H01S 5/041* (2013.01); *H04B 10/504* (2013.01); *H01S 5/005* (2013.01); *H01S 5/0021* (2013.01);
(Continued)

(58) Field of Classification Search
CPC ...... H01S 5/041; H01S 5/06213; H01S 5/005; H01S 5/02284; H01S 5/0021; H01S 5/183; H04B 10/504
See application file for complete search history.

(56) References Cited

U.S. PATENT DOCUMENTS

| | | |
|---|---|---|
| 4,767,168 A | 8/1988 | Grandy |
| 4,811,361 A | 3/1989 | Bacou et al. |

(Continued)

OTHER PUBLICATIONS

Dutton, Harry J.R., "Understanding Optical Communications," IBM, International Technical Support Organization, Retrieved from http://www.redbooks.ibm.com, 638 pages.
(Continued)

*Primary Examiner* — Xinning Niu
(74) *Attorney, Agent, or Firm* — Pillsbury Winthrop Shaw Pittman LLP

(57) ABSTRACT

A method, system and an apparatus for hybrid optical and electrical pumping of semiconductor lasers and light-emitting diodes (LEDs) improves reliability at high operating temperatures. The semiconductor laser or LED is biased via optical pumping and a relatively small electrical modulation current modulates the laser. At low modulation speeds, the modulation current is substantially lower than that required for biasing the laser or directly modulating it at high speeds. The lifetime of the laser is improved by substantially reducing the operating current, enabling laser lifetimes adequate for operation in many applications, such as deep-hole oil drilling and jet engine control, where operation is not currently possible.

17 Claims, 1 Drawing Sheet

(51) Int. Cl.
   *H01S 5/183* (2006.01)
   *H01S 5/00* (2006.01)
   *H01S 5/022* (2006.01)
   *H01S 5/062* (2006.01)

(52) U.S. Cl.
   CPC ....... *H01S 5/02284* (2013.01); *H01S 5/06213* (2013.01); *H01S 5/183* (2013.01)

(56) References Cited

U.S. PATENT DOCUMENTS

| | | | |
|---|---|---|---|
| 4,895,426 A | 1/1990 | Pinson | |
| 4,930,049 A | 5/1990 | Davenport et al. | |
| 5,212,750 A | 5/1993 | Wright | |
| 5,771,114 A | 6/1998 | Andersson et al. | |
| 5,844,236 A | 12/1998 | Wilson | |
| 5,847,863 A * | 12/1998 | Galvanauskas | H01S 3/0057 359/333 |
| 6,052,248 A | 4/2000 | Reed et al. | |
| 6,052,632 A | 4/2000 | Iihoshi et al. | |
| 6,222,976 B1 | 4/2001 | Shahid | |
| 6,351,590 B1 | 2/2002 | Shahid | |
| 6,519,395 B1 | 2/2003 | Bevan et al. | |
| 6,631,490 B2 | 10/2003 | Shimoda | |
| 6,694,083 B2 | 2/2004 | Paradiso et al. | |
| 6,795,947 B1 | 9/2004 | Siegel et al. | |
| 6,804,270 B1 * | 10/2004 | Vakhshoori | H01S 3/06754 372/20 |
| 6,978,319 B1 | 12/2005 | Rostoker et al. | |
| 6,989,776 B2 | 1/2006 | Tsang | |
| 7,000,177 B1 | 2/2006 | Wu et al. | |
| 7,030,789 B1 | 4/2006 | Cideciyan et al. | |
| 7,044,656 B1 | 5/2006 | Hofmeister et al. | |
| 7,071,851 B1 | 7/2006 | Blaum et al. | |
| 7,103,830 B1 | 9/2006 | Dong | |
| 7,120,778 B2 | 10/2006 | Zimmer | |
| 7,174,485 B2 | 2/2007 | Silvus | |
| 7,290,184 B2 | 10/2007 | Bruner et al. | |
| 7,307,556 B2 | 12/2007 | Lee | |
| 7,362,936 B2 | 4/2008 | Stark et al. | |
| 7,409,622 B1 | 8/2008 | Lu et al. | |
| 7,515,619 B2 | 4/2009 | Juluri | |
| 7,515,797 B2 | 4/2009 | Stark et al. | |
| 7,515,798 B2 | 4/2009 | Stark et al. | |
| 7,714,748 B1 | 5/2010 | Chaichanavong | |
| 7,949,025 B2 | 5/2011 | Olea | |
| 7,962,827 B2 | 6/2011 | Tang et al. | |
| 8,049,648 B2 | 11/2011 | Chaichanavong | |
| 8,055,977 B2 | 11/2011 | Ito | |
| 8,069,391 B1 | 11/2011 | Wu et al. | |
| 8,151,162 B2 | 4/2012 | Kanaoka et al. | |
| 8,161,347 B1 | 4/2012 | Kou | |
| 8,225,148 B2 | 7/2012 | Tang et al. | |
| 8,904,258 B2 | 12/2014 | Stark | |
| 9,020,344 B2 | 4/2015 | Stark | |
| 2004/0175077 A1 | 9/2004 | Weber | |
| 2005/0259571 A1 | 11/2005 | Battou | |
| 2006/0140564 A1 | 6/2006 | Upton | |
| 2006/0159462 A1 | 7/2006 | Aronson et al. | |
| 2006/0230425 A1 | 10/2006 | Shani et al. | |
| 2007/0153868 A1 * | 7/2007 | West | G02B 6/12004 372/92 |
| 2009/0135868 A1 | 5/2009 | Ishibashi | |
| 2010/0061726 A1 | 3/2010 | Barbarossa et al. | |
| 2011/0291578 A1 | 12/2011 | Philippbar et al. | |
| 2013/0121356 A1 * | 5/2013 | Sugawara | H05B 33/0845 372/38.02 |
| 2014/0186023 A1 | 7/2014 | Louderback | |

OTHER PUBLICATIONS

Papadimitriou, G.I., et al., "Optical Switching: Switch Fabrics, Techniques, and Architectures," Journal of Lightwave Technology, 21(2), 384-405, Feb. 2003.

Popplewell et al., "Peforrnance Aspects of Error Correcting Line Codes," Second IEEE National Conference on Telecommunications, pp. 47-52, 1989.

Small, B.A., et al., "The Current and Future State of Optical Switching Technologies as Relaed to the Data Vortex Photonic Switching Architecture," 6 pages.

Yang, Q. et al., "New Switch Fabric Architecture for Bursty Traffic," IEEE, 43-44, 2002.

* cited by examiner

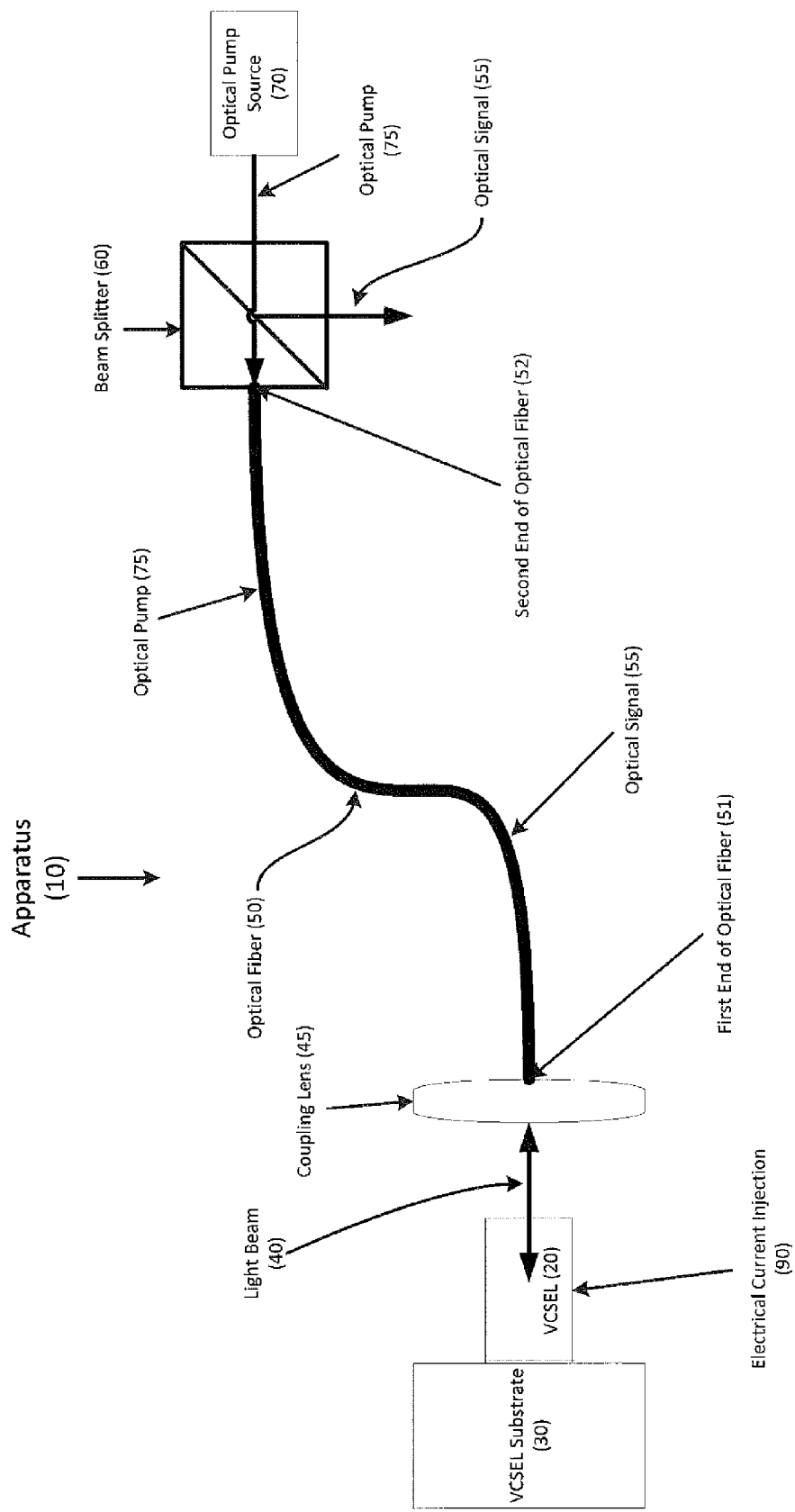

METHOD, SYSTEM AND APPARATUS FOR HYBRID OPTICAL AND ELECTRICAL PUMPING OF SEMICONDUCTOR LASERS AND LEDS FOR IMPROVED RELIABILITY AT HIGH TEMPERATURES

CROSS REFERENCE TO RELATED APPLICATION

This application claims the benefit of U.S. Provisional Application Ser. No. 61/747,298 entitled "Method and Apparatus for Hybrid Optical and Electrical Pumping of Semiconductor Lasers and LEDs for Improved Reliability at High Temperatures" filed Dec. 29, 2012. The above-referenced provisional application is hereby incorporated herein by reference in its entirety.

BACKGROUND OF THE INVENTION

This invention relates to laser modulation and reliability particularly for operation in high temperature applications.

The upper operating temperature of optical modules may be limited by the lifetime of the lasers and/or the light emitting diodes (LEDs) used in the modules. For example, the lifetime may be limited by long term wear out. The upper operating temperature of optical modules may be extended by using devices that are capable of operating at high temperatures and using heat sinking. The upper operating temperature of optical modules may also be extended by operating the devices with the minimum possible bias current. For relatively low-speed applications (below 1 Gbps), optical modules may be conceived and implemented with the capability to operate in ambient temperatures as high as 150° C. The lifetimes (mean-time-to-failure or "MTTF") of such devices may be thousands to ten thousands of hours. These lifetimes may be sufficient for some applications. However, many applications, such as deep-hole oil drilling and jet engine control, require operating temperatures of 175° C. or even higher. Current technology does not provide a way of achieving these temperatures with sufficient optical module lifetime as the laser and/or LED lifetime may be severely degraded due to the inherent physics that cause laser degradation, such as migration of defects. Thermoelectric coolers may be a potential solution; however, these devices also lack the ability to operate reliably at very high temperatures.

SUMMARY OF THE INVENTION

To this end, an apparatus having an optically and electrically pumped semiconductor laser or light emitting diode (LED) is provided. The apparatus may also have a semiconductor light source and electrical current injection. The apparatus also may have an optical fiber and a pump light source at a remote location. Finally, the apparatus may have optics at the semiconductor laser configured to couple light from the optical fiber into the semiconductor laser for optical pumping and to couple light from the semiconductor laser into the same or a different optical fiber.

In an embodiment, the pump light source may be a semiconductor having a wavelength suitable for optically pumping the semiconductor light source.

In an embodiment, the optical fiber may be a single mode fiber or a multimode fiber.

In an embodiment, the optical fiber may be glass or may be polymer.

In an embodiment, the temperature at the semiconductor light source may not be conducive to the required reliability with only electrical biasing and modulation.

In an embodiment, the pump light source may be located in a remote location where the temperature is conducive to the required reliability with electrical biasing.

In an embodiment, the semiconductor light source may be biased with optical pumping and modulated with electrical current injection.

In an embodiment, the modulation by electrical current injection may be digital data and/or analog data.

In an embodiment, the electrical current injection may be a portion of the total bias.

In an embodiment, the electrical current injection results in a direct current bias conducive to the required reliability of the semiconductor light source at its ambient temperature.

In an embodiment, the optical pumping to bias the semiconductor light source may avoid resistive heating associated with electrical bias currents.

In an embodiment, the optics may also have a beam splitter.

In an embodiment, the semiconductor light source may be one or more of the following: a light emitting diode (LED), a vertical-cavity surface-emitting laser (VCSEL), a Fabry-Perot laser, and/or a distributed feedback (DFB) laser.

In another embodiment of the invention, a method of optically and electrically pumping a semiconductor light source is provided. The method may have the steps of: supplying an electrical current injection to the semiconductor light source; configuring optics at the semiconductor light source to couple light from the semiconductor light source into an optical fiber; providing a pump light source at a remote location; and configuring optics to couple light from the pump light source into the same or a different optical fiber for optical pumping of the semiconductor light source.

In an embodiment, the method may have the step of arranging a beam splitter at the pump light source to couple a portion of the light from the pump light source into the optical fiber for optical pumping of the semiconductor light source.

In an embodiment, the method may have the step of selecting a wavelength of the pump light source suitable for optically pumping the semiconductor light source.

In an embodiment, the method may have the step of modulating the semiconductor light source with electrical current injection.

In an embodiment, the modulation of the semiconductor light source with electrical current injection may be used to transmit data optically.

In an embodiment, the semiconductor light source may be directly modulated using the electrical current injection.

In an embodiment, the modulation of the semiconductor light source may be for the purpose of data transmission.

In an embodiment, the method may have the step of biasing the semiconductor light source with optical pumping.

BRIEF DESCRIPTION OF THE DRAWINGS

FIG. 1 is a schematic diagram of an embodiment of a VCSEL with hybrid optical and electrical pumping for achieving reliable operation at high temperatures in accordance with the embodiments disclosed herein.

DETAILED DESCRIPTION OF THE INVENTION

A semiconductor laser and/or LED may be biased using optical pumping and may be directly modulated using a relatively small electrical current that may be used to convert the incoming electrical signal into an optical signal. An optical fiber may be used to provide the light for biasing the laser via optical pumping, as well as collect the modulated optical signal for data transmission. The light source for optically pumping the laser may be of a wavelength that may be absorbed by the active region of the laser and may be a shorter wavelength than that of the optical signal emitted by the laser.

FIG. 1 is a schematic diagram of an embodiment of an apparatus having a VCSEL with hybrid optical and electrical pumping for achieving reliable operation at high temperatures. In particular, an apparatus 10 may have a VCSEL 20 fabricated on a VCSEL substrate 30. While FIG. 1 illustrates a VCSEL 20, the invention is not intended to be limited to only a VCSEL. Any semiconductor light source may be used. A light beam 40 may be coupled by optics 45 into and/or out of an optical fiber 50. The optical fiber 50 may have a first end 51 and a second end 52. The second end 52 of the optical cable 50 may be remotely located a distance from the first end 51 of the optical cable 50. The light beam 40 may be bidirectional as indicated in FIG. 1. The VCSEL 20 may provide an optical signal 55 that may be carried in the optical fiber 50. Thus, the light beam 40 may comprise the optical signal 55 emitted from the VCSEL 20 and an optical pump 75 emitted by the optical pump source 70. The optics 45 may comprise a coupling lens and/or the like.

The apparatus 10 may also have a beam splitter 60 located remotely at the second end 52 of the optical fiber 50. The apparatus 10 may also have an optical pump source 70. The optical pump source 70 may provide the optical pump 75 of a particular wavelength. The wavelength may be selected to efficiently pump the VCSEL 20. The bidirectional light beam 40 may also have the optical pump 75 from the optical pump source 70. The optical pump 75 from the optical pump source 70 may be used to bias the VCSEL 20. The beam splitter 60 may be used to spatially separate the optical pump 75 of the optical pump source 70 and the optical signal 55 from the VCSEL 20. The beam splitter 60 may enable the single optical fiber 50 to carry both the optical pump beam 75 and the optical signal 55. Although the use of a single optical fiber is shown in FIG. 1, the invention is not intended to be limited to the use of a single optical fiber and is intended to include the use of separate optical fibers for the optical pump and the optical signal eliminating the need for the beam splitter. In addition, optical pumping of the semiconductor laser can be achieved in a variety of ways including vertical illumination from the top or through the substrate, as well as laterally through the side or ends of the semiconductor laser source. The invention is intended to include these configurations and is not intended to be limited to the specific configuration shown in FIG. 1. The apparatus 10 may enable the optical pump source 70 and the optical receiver of the optical link to be placed remotely in a lower temperature environment, while the data generated in the high temperature environment may be transmitted optically over the optical fiber 50 by directly modulating the VCSEL 20. The apparatus 10 also may have an electrical current injection 90 supplied to the VCSEL 20 to provide modulation of the VCSEL 20. At low modulation speeds, the modulation current provided by the electrical current injection 90 may be substantially lower than that required for biasing the VCSEL 20 or directly modulating the VCSEL 20 at high speeds.

For lasers where optical facet damage is not a limiting factor, such as VCSELs, the lifetime of the laser may be primarily determined by two factors. For example, one factor may be an exponential dependence of the lifetime on junction temperature. Another determining factor may be a factor that varies with approximately the square of the current. Thus, the modulation current provided by the electrical current injection 90 may play a major role in extending the lifetime of the laser. While very high operating temperatures may still have a substantial negative effect on laser lifetime, substantially reducing the operating current may have a significant positive effect on laser lifetime, enabling laser lifetimes adequate for operation in many applications, such as deep-hole oil drilling and jet engine control, where operation is not currently possible.

It should be understood that various changes and/or modifications to the presently preferred embodiments described herein will be apparent to those skilled in the art. Such changes and/or modifications may be made without departing from the spirit and/or scope of the present invention and without diminishing its attendant advantages. It is, therefore, intended that such changes and/or modifications be covered by the appended claims.

The invention claimed is:

1. An apparatus, comprising:
a semiconductor laser source;
a pump light source located remotely relative to the semiconductor laser source wherein the pump light source produces an optical pump beam;
an optical fiber positioned between the semiconductor laser source and the pump light source wherein the optical fiber has a first end and a second end, wherein the second end is located at a distance remote from the first end;
optics arranged at the semiconductor laser source, wherein the optics are configured to couple a laser light signal from the semiconductor laser source into the first end of the optical fiber, and to couple the optical pump beam from the pump light source to the second end of the optical fiber and into the semiconductor laser source for optical pumping of the semiconductor laser source; and
an electrical current injection supplied to the semiconductor laser source, wherein the electrical current injection is configured to modulate the semiconductor laser source to generate the laser light signal,
wherein the semiconductor laser source is located at a first location and the optical pump light source is located at a second location remote from the first location, and an ambient temperature at the second location is lower than an ambient temperature at the first location.

2. The apparatus of claim 1, further comprising:
a beam splitter located adjacent the second end of the optical fiber, the beam splitter being configured and arranged to split the optical pump beam from the laser light signal.

3. The apparatus of claim 1, wherein the pump light source is a semiconductor laser having a wavelength selected to optically pump the semiconductor laser source.

4. The apparatus of claim 1, wherein the optical fiber comprises a single mode fiber, a multimode fiber, glass or polymer, or any combination thereof.

5. The apparatus of claim 1, wherein the semiconductor laser source is modulated by the electrical current injection using a digital data modulation signal or an analog data modulation signal.

6. The apparatus of claim 1, wherein the electrical current injection comprises a portion of a total bias of the semiconductor laser source.

7. The apparatus of claim 1, wherein the electrical current injection is configured to generate a current bias in the semiconductor laser source so as to reliably operate the semiconductor laser source at its ambient temperature.

8. The apparatus of claim 1, wherein the optical pump beam is configured to bias the semiconductor laser source without significantly heating the semiconductor laser source.

9. The apparatus of claim 1, wherein the semiconductor laser source comprises a laser light emitting diode (LED), a vertical-cavity surface-emitting laser (VCSEL), a Fabry-Perot laser, or a distributed feedback (DFB) laser.

10. A method of remotely pumping a semiconductor laser source, the method comprising:
supplying an optical pump beam generated by a pump light source to a semiconductor laser source through an optical fiber to optically pump the semiconductor laser source, the semiconductor laser source being located at a first end of the optical fiber and the optical pump light source being located at a second end of the optical fiber and remote from the first end of the optical fiber;
supplying an electrical current to the semiconductor laser source to modulate the semiconductor laser source to generate a modulated laser signal;
coupling the modulated laser signal into the first end of the optical fiber;
transmitting the modulated signal through the optical fiber from the first end of the optical fiber to the second end of the optical fiber,
wherein the semiconductor laser source is located at a first location and the optical pump light source is located at a second location remote from the first location, and an ambient temperature at the second location is lower than an ambient temperature at the first location.

11. The method of claim 10 further comprising: coupling at least a portion of the optical pump beam from the pump light source into the optical fiber for optical pumping of the semiconductor laser source using a beam splitter disposed between the optical pump source and the second end of the optical fiber.

12. The method of claim 10, further comprising:
selecting a wavelength of the pump light source suitable for optically pumping the semiconductor laser source.

13. The method of claim 10, further comprising:
selecting a wavelength of the pump light source suitable for optically pumping the semiconductor laser source wherein the wavelength is selected to be absorbed by an active region of the semiconductor laser source.

14. The method of claim 10, further comprising:
selecting a wavelength of the pump light source suitable for optically pumping the semiconductor laser source wherein the wavelength of the pump light source is selected to be a shorter wavelength than that of the modulated laser signal emitted by the semiconductor laser source.

15. The method of claim 10, further comprising:
biasing the semiconductor laser source with optical pumping.

16. An optical link system comprising:
a semiconductor laser biased using optical pumping and directly modulated using an electrical signal to convert the electrical signal into an optical signal;
a pump light source having a wavelength for optically pumping the semiconductor laser wherein the wavelength is absorbed by an active region of the semiconductor laser and is a shorter wavelength than that of the optical signal emitted by the semiconductor laser; and
an optical fiber configured and arranged to transmit light from the pump light source to the semiconductor laser to bias the semiconductor laser via the optical pumping, wherein the optical fiber is further configured to transmit the optical signal for data transmission,
wherein the semiconductor laser source is located at a first location and the optical pump light source is located at a second location remote from the first location, and an ambient temperature at the second location is lower than an ambient temperature at the first location.

17. The apparatus of claim 1, wherein the electrical current injection is configured to modulate the semiconductor laser source at a lower modulation current when modulation speed decreases.

* * * * *